(12) United States Patent
Lin et al.

(10) Patent No.: US 9,379,215 B2
(45) Date of Patent: Jun. 28, 2016

(54) FIN FIELD EFFECT TRANSISTOR

(71) Applicant: Taiwan Semiconductor Manufacturing Company, Ltd., Hsin-Chu (TW)

(72) Inventors: Hung-Ta Lin, Hsinchu (TW); Chu-Yun Fu, Hsinchu (TW); Hung-Ming Chen, Zhubei (TW); Shu-Tine Yang, Taichung (TW); Shin-Yeh Huang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/960,807

(22) Filed: Dec. 7, 2015

(65) Prior Publication Data

US 2016/0087079 A1     Mar. 24, 2016

Related U.S. Application Data

(60) Division of application No. 14/337,494, filed on Jul. 22, 2014, now Pat. No. 9,209,300, which is a continuation of application No. 13/859,505, filed on Apr. 9, 2013, now Pat. No. 8,809,940, which is a division of application No. 12/903,712, filed on Oct. 13, 2010, now Pat. No. 8,440,517.

(51) Int. Cl.
*H01L 29/02* (2006.01)
*H01L 29/66* (2006.01)
*H01L 21/02* (2006.01)

(52) U.S. Cl.
CPC .... *H01L 29/66636* (2013.01); *H01L 21/02293* (2013.01); *H01L 29/66795* (2013.01)

(58) Field of Classification Search
CPC ......... H01L 21/84; H01L 27/12; H01L 29/78; H01L 29/785; H01L 29/7853; H01L 29/66795; H01L 29/42384
USPC ........................................................ 438/172
See application file for complete search history.

(56) References Cited

U.S. PATENT DOCUMENTS 8,809,940 B2 * 8/2014 Lin ................... H01L 29/66795
257/327
8,866,192 B1 * 10/2014 Chen ................... H01L 21/2653
257/194

* cited by examiner

*Primary Examiner* — Michael Lebentritt
(74) *Attorney, Agent, or Firm* — Haynes and Boone, LLP

(57) ABSTRACT

A method of fabricating a fin field effect transistor (FinFET) including forming a first insulation region and a second insulation region and fin there between. The method further includes forming a gate stack over a portion of the fin and over a portion of the first and second insulation regions. The method further includes tapering the top surfaces of the first and second insulation regions not covered by the gate stack.

20 Claims, 10 Drawing Sheets

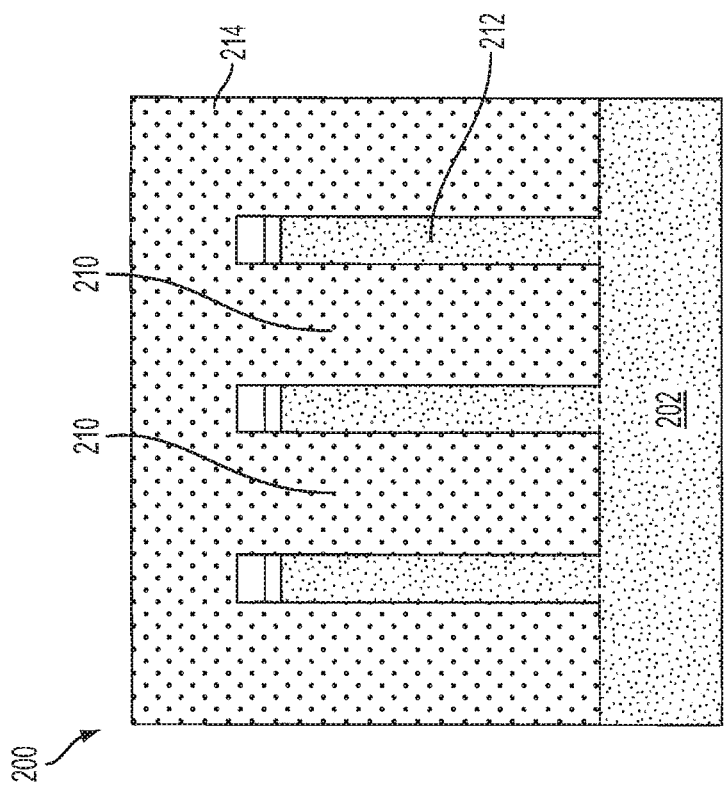
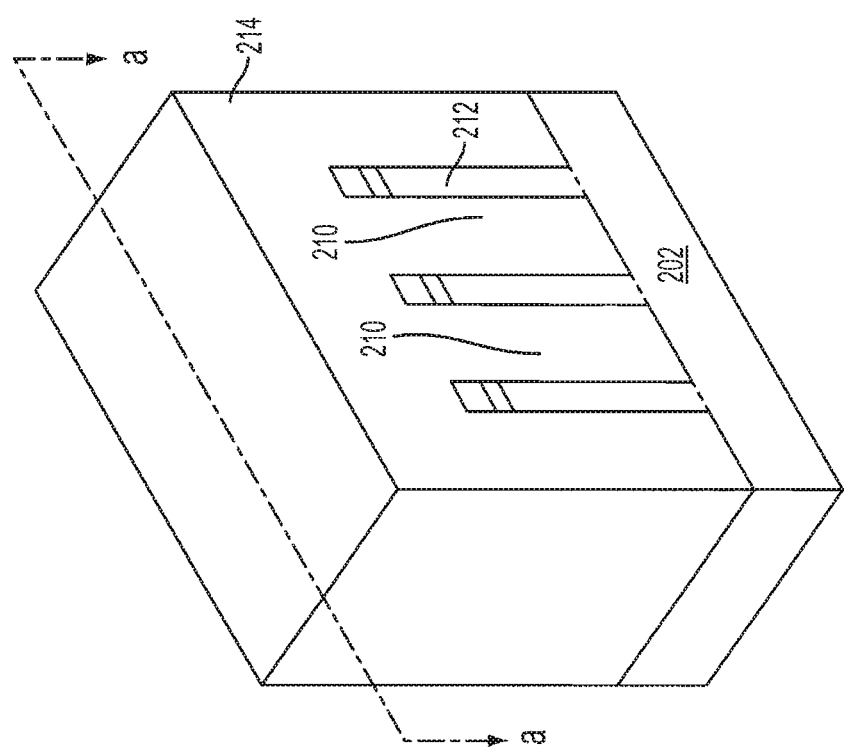
FIG. 4B
FIG. 4A

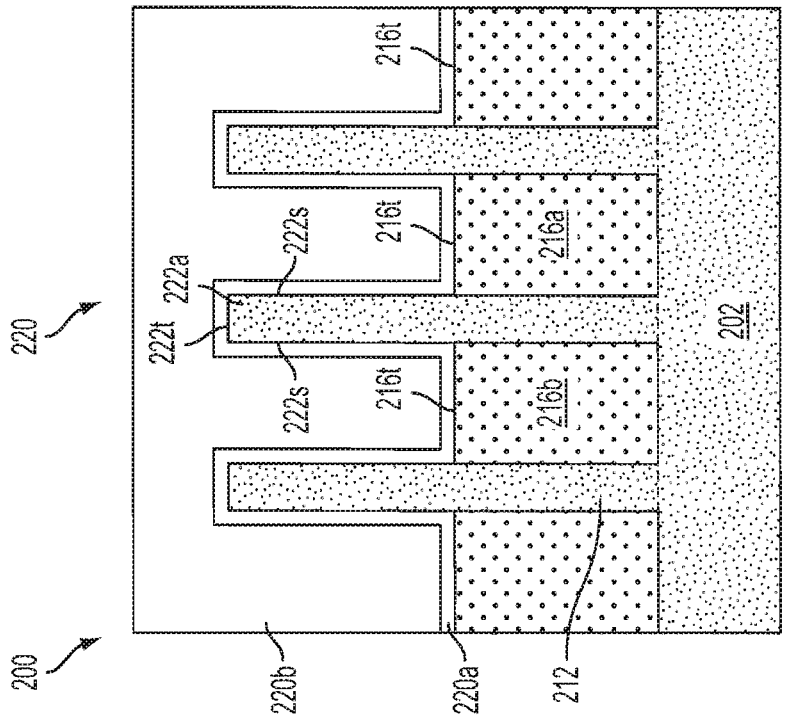
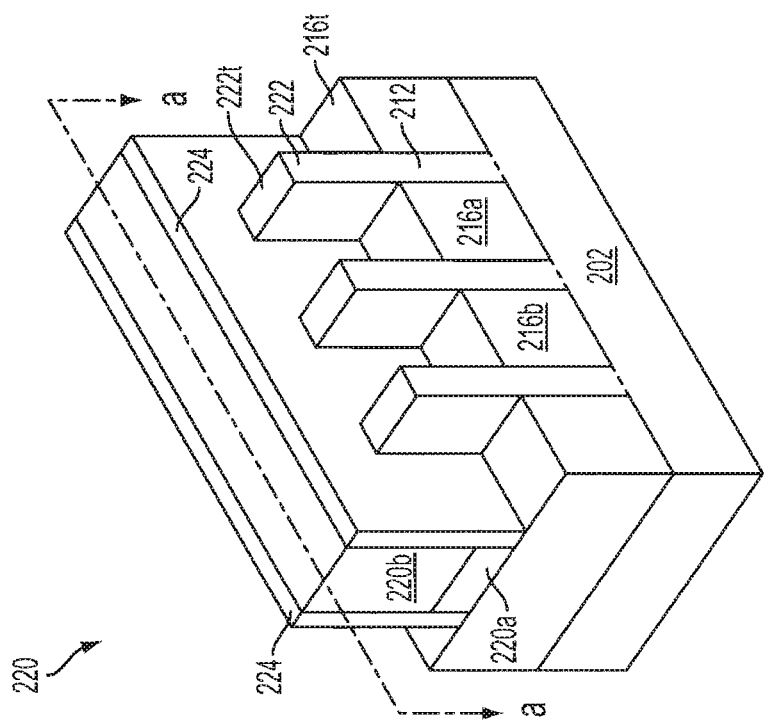
FIG. 7B
FIG. 7A

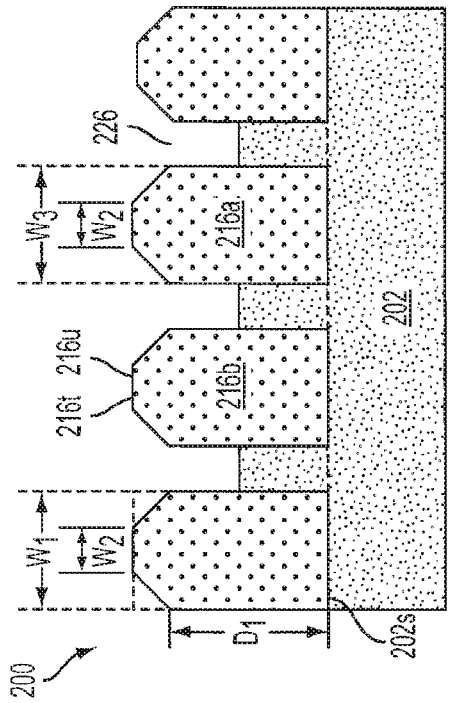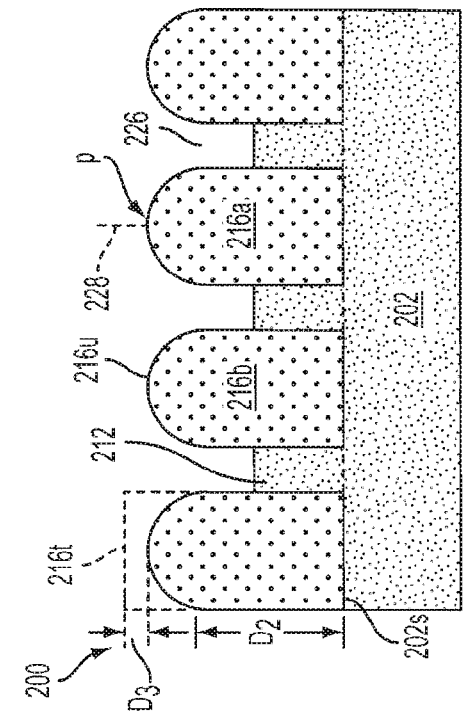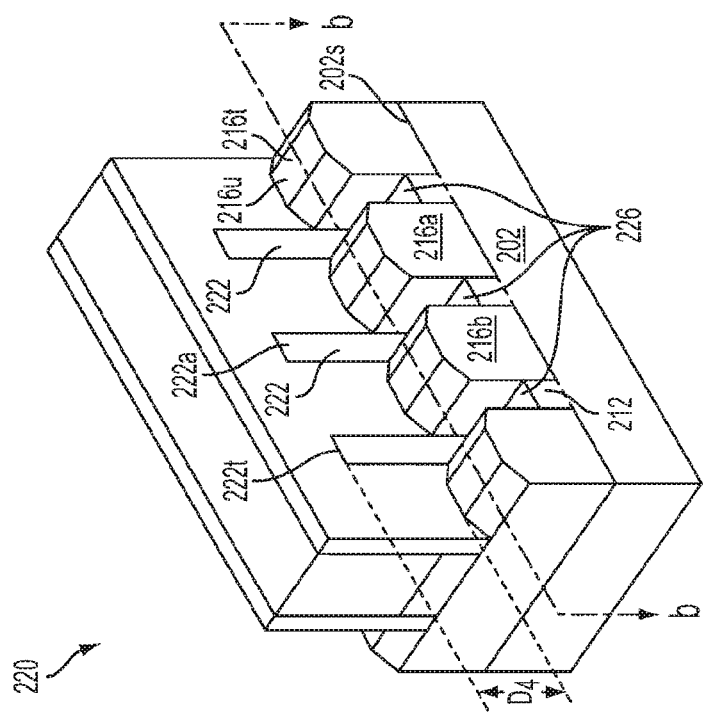
FIG. 9B
FIG. 9C
FIG. 9A

FIN FIELD EFFECT TRANSISTOR

PRIORITY CLAIM

The present application is divisional of U.S. application Ser. No. 14/337,494, filed Jul. 22, 2014, issuing on Dec. 8, 2015 as U.S. Pat. No. 9,209,300, which is a continuation of U.S. application Ser. No. 13/859,505, filed Apr. 9, 2013, now U.S. Pat. No. 8,809,940, which is a divisional of U.S. application Ser. No. 12/903,712, filed Oct. 13, 2010, now U.S. Pat. No. 8,440,517, all of which are incorporated herein by reference in their entireties.

RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES. All of the above applications are incorporated herein by reference in their entireties.

TECHNICAL FIELD

The disclosure relates to integrated circuit fabrication, and more particularly to a fin field effect transistor.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in recessed source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, non-uniform distribution of strained materials causes non-uniformity of strains applied to the channel region of the FinFET, thereby increasing the likelihood of device instability and/or device failure.

Accordingly, what are needed are an improved device and a method for fabricating a strained structure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-10C are perspective and cross-sectional views of a FinFET at various stages of fabrication according to various embodiments of the present disclosure.

DESCRIPTION

Figure 1:
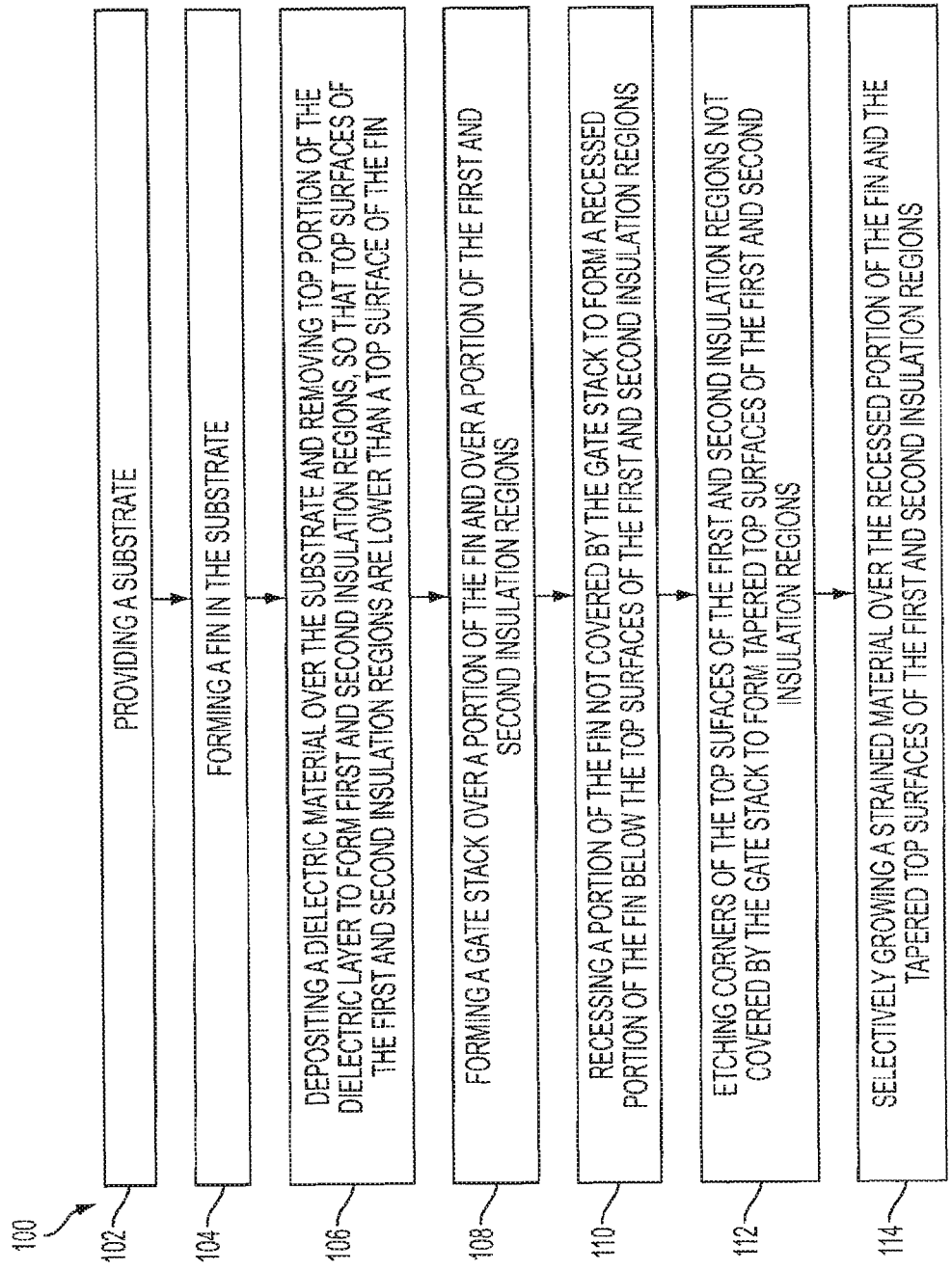
FIG. 1 is a flowchart illustrating a method of fabricating a FinFET according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a fin field effect transistor (FinFET) according to various aspects of the present disclosure. The method 100 begins with step 102 in which a substrate is provided. The method 100 continues with step 104 in which a fin is formed in the substrate. The method 100 continues with step 106 in which a dielectric material is deposited over the substrate and top portion of the dielectric layer is removed to form first and second insulation regions, so that top surfaces of the first and second insulation regions are below a top surface of the fin. The method 100 continues with step 108 in which a gate stack is formed over a portion of the fin and over a portion of the first and second insulation regions. The method 100 continues with step 110 in which a portion of the fin not covered by the gate stack is recessed to form a recessed portion of the fin below the top surfaces of the first and second insulation regions. The method 100 continues with step 112 in which corners of the top surfaces of the first and second insulation regions not covered by the gate stack is etched to form tapered top surfaces of the first and second insulation regions. The method 100 continues with step 114 in which a strained material is selectively grown over the recessed portion of the fin and the tapered top surfaces of the first and second insulation regions.

As employed in the present disclosure, the FinFET 200 refers to any fin-based, multi-gate transistor. The FinFET 200 may be included in a microprocessor, memory cell, and/or other integrated circuit (IC). It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10C are simplified for a better understanding of the inventive concepts of the present disclosure. For example, although the figures illustrate the FinFET 200, it is understood the IC may comprise a number of other devices comprising resistors, capacitors, inductors, fuses, etc.

Referring to FIGS. 2A-10C, illustrated are various perspective and cross-sectional views of the FinFET 200 at various stages of fabrication according to various embodiments of the present disclosure.

Figure 2B:
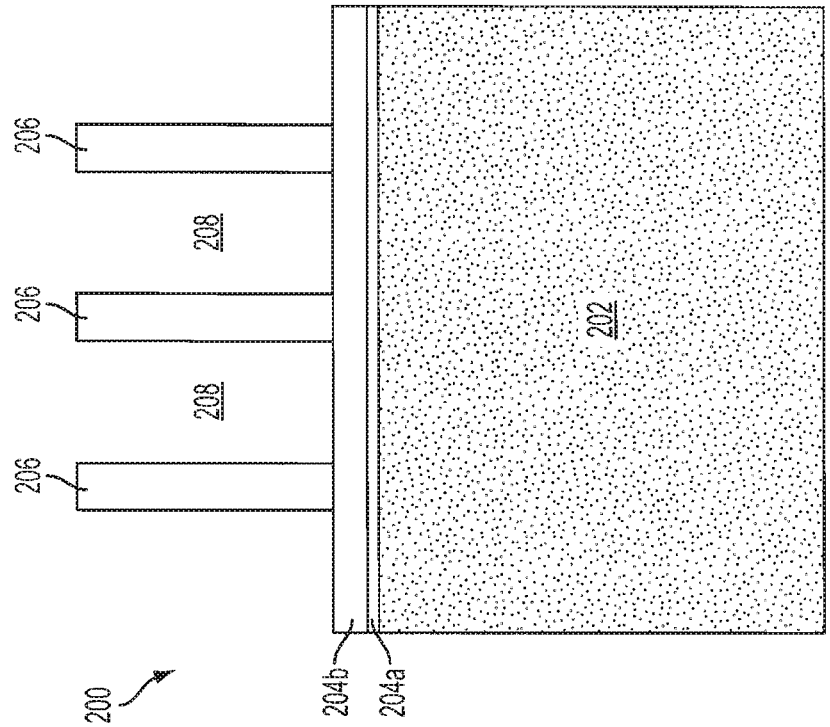
Figure 2A:
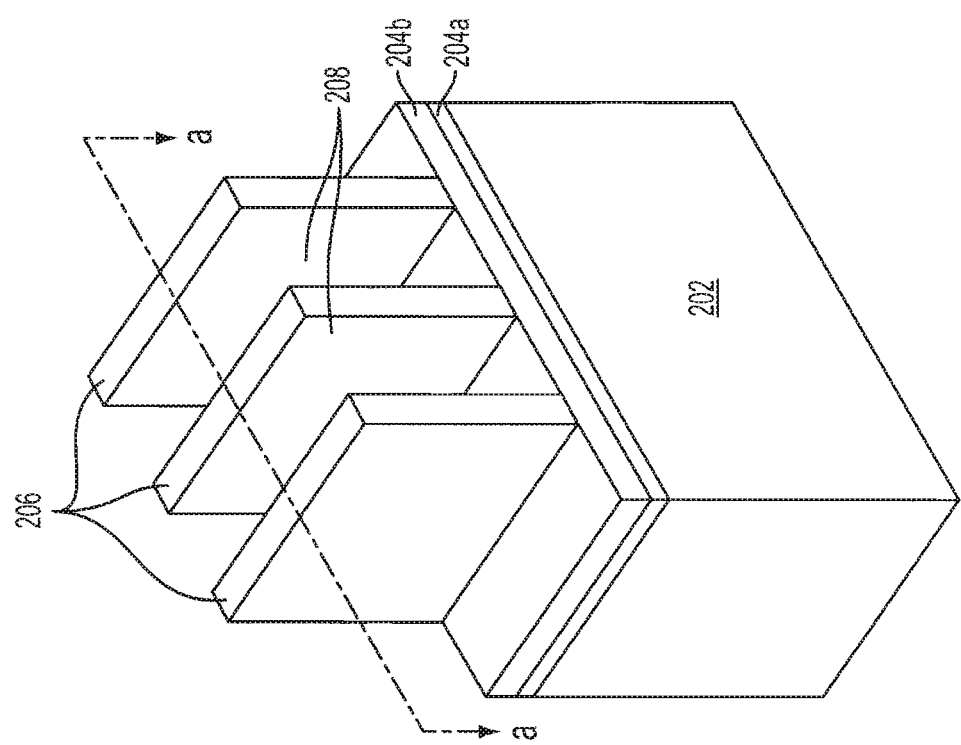

FIG. 2A is a perspective view of the FinFET 200 having a substrate 202 at one of various stages of fabrication according to an embodiment, and FIG. 2B is a cross-sectional view of a FinFET taken along the line a-a of FIG. 2A. In one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or BF2; n-type dopants, such as phosphorus or arsenic; and/or combinations thereof. The doped regions may be configured for an n-type FinFET, or alternatively configured for a p-type FinFET.

In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

The fins are formed by etching into the substrate 202. In one embodiment, a pad layer 204a and a mask layer 204b are formed on the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In at least one embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 3A:
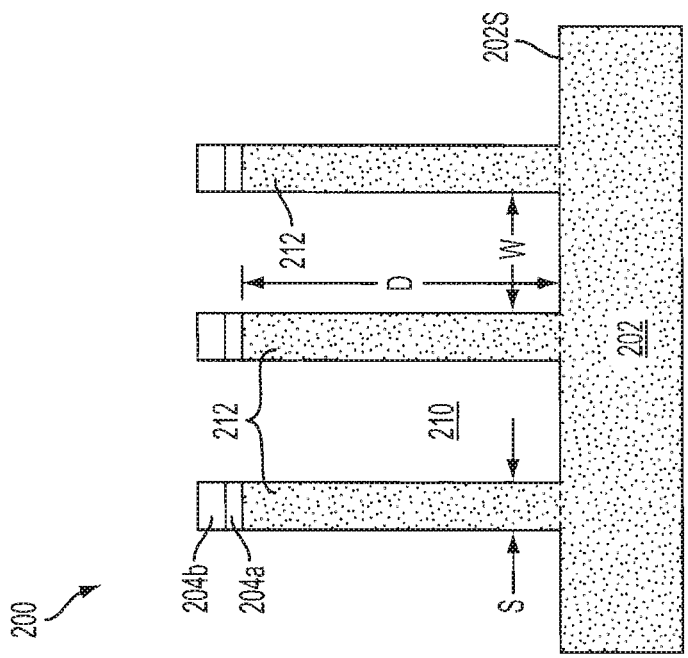
Figure 3B:
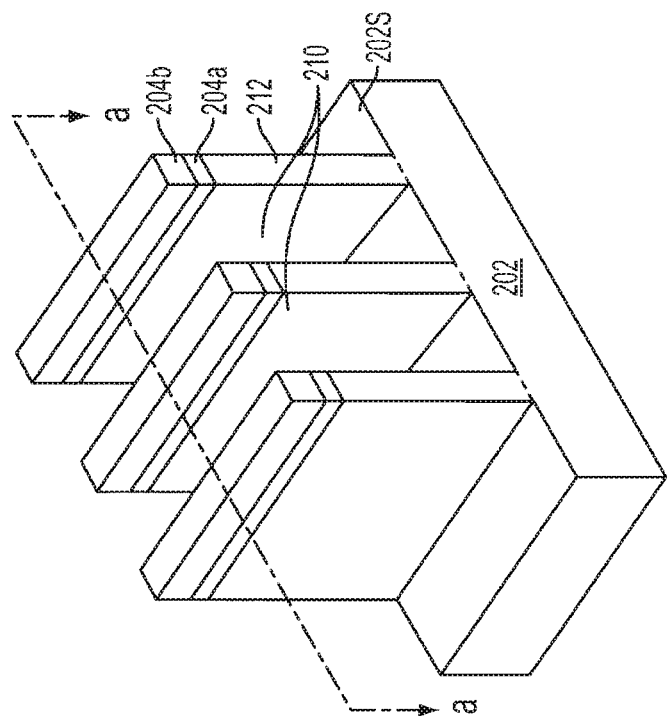

FIG. 3A is a perspective view of the FinFET 200 at one of various stages of fabrication according to an embodiment, and FIG. 3B is a cross-sectional view of a FinFET taken along the line a-a of FIG. 3A. The mask layer 204b and pad layer 204a are etched through openings 208 to expose underlying semiconductor substrate 202. The exposed semiconductor substrate 202 is then etched to form trenches 210 with top surfaces 202s of the semiconductor substrate 202. Portions of the semiconductor substrate 202 between trenches 210 form semiconductor fins 212. Trenches 210 may be strips (viewed from in the top of the FinFET 200) parallel to each other, and closely spaced with respect to each other. Trenches 210 each have a width W, a depth D, and are spaced apart from adjacent trenches by a spacing S. For example, the spacing S between trenches 210 may be smaller than about 30 nm. The photo-sensitive layer 206 is then removed. Next, a cleaning may be performed to remove a native oxide of the semiconductor substrate 202. The cleaning may be performed using diluted hydrofluoric (DHF) acid.

In some embodiments, depth D of the trenches 210 may range from about 2100 Å to about 2500 Å, while width W of the trenches 210 ranges from about 300 Å to about 1500 Å. In an exemplary embodiment, the aspect ratio (D/W) of the trenches 210 is greater than about 7.0. In some other embodiments, the aspect ratio may even be greater than about 8.0. In yet some embodiments, the aspect ratio is lower than about 7.0 or between 7.0 and 8.0. One skilled in the art will realize, however, that the dimensions and values recited throughout the descriptions are merely examples, and may be changed to suit different scales of integrated circuits.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

FIG. 4A is a perspective view of the FinFET 200 at one of various stages of fabrication according to an embodiment, and FIG. 4B is a cross-sectional view of the FinFET taken along the line a-a of FIG. 4A. Trenches 210 are filled with a dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In an embodiment, the oxide 214 may be formed using a high-density-plasma (HDP) CVD process, using silane (SiH4) and oxygen (O2) as reacting precursors. In other embodiments, the oxide 214 may be formed using a sub-atmospheric CVD (SACVD) process or high aspect-ratio process (HARP), wherein process gases may comprise tetraethylorthosilicate (TEOS) and/or ozone (O3). In yet other embodiments, the oxide 214 may be formed using a spin-on-dielectric (SOD) process, such as hydrogen silsesquioxane (HSQ) or methyl silsesquioxane (MSQ).

Figure 5B:
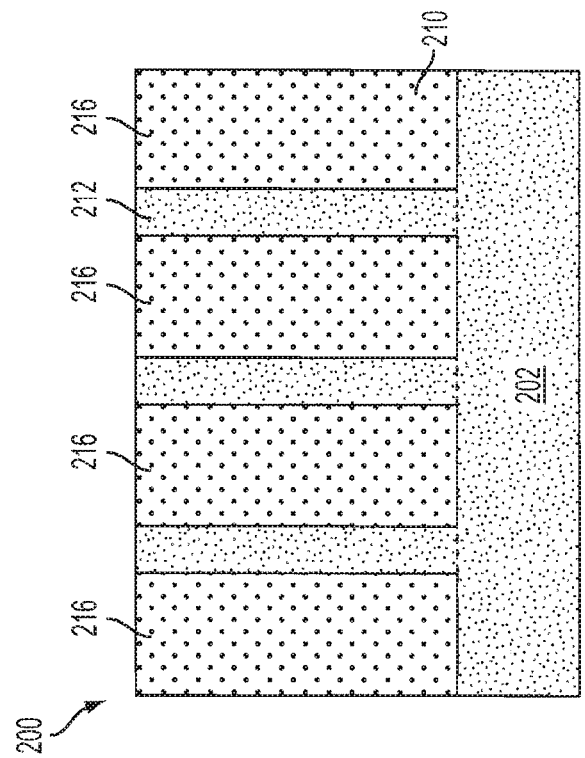
Figure 5A:
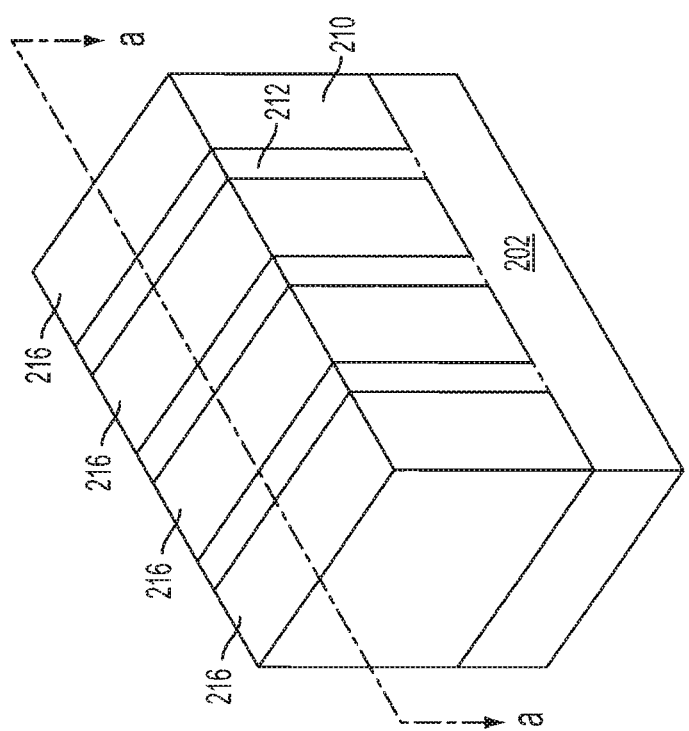
Figure 6B:
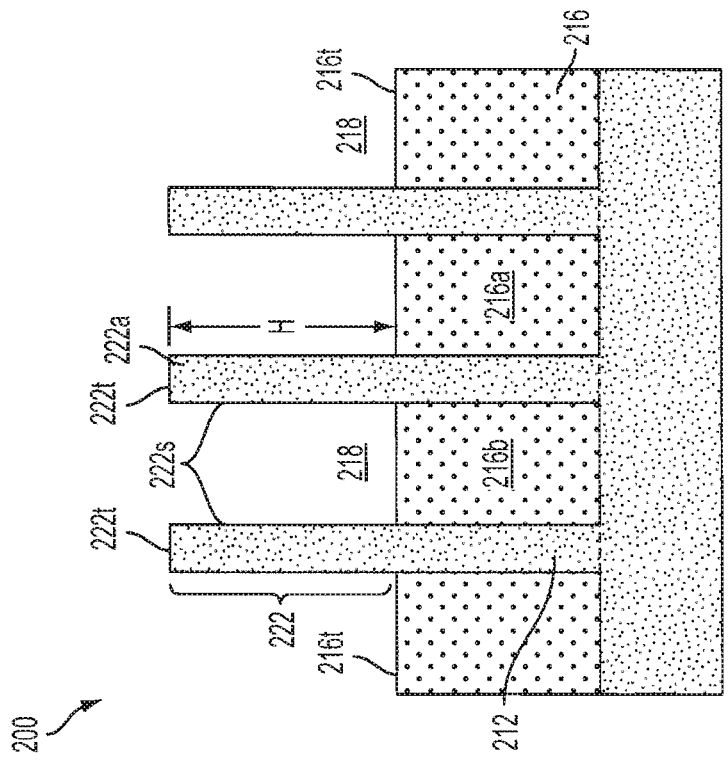
Figure 6A:
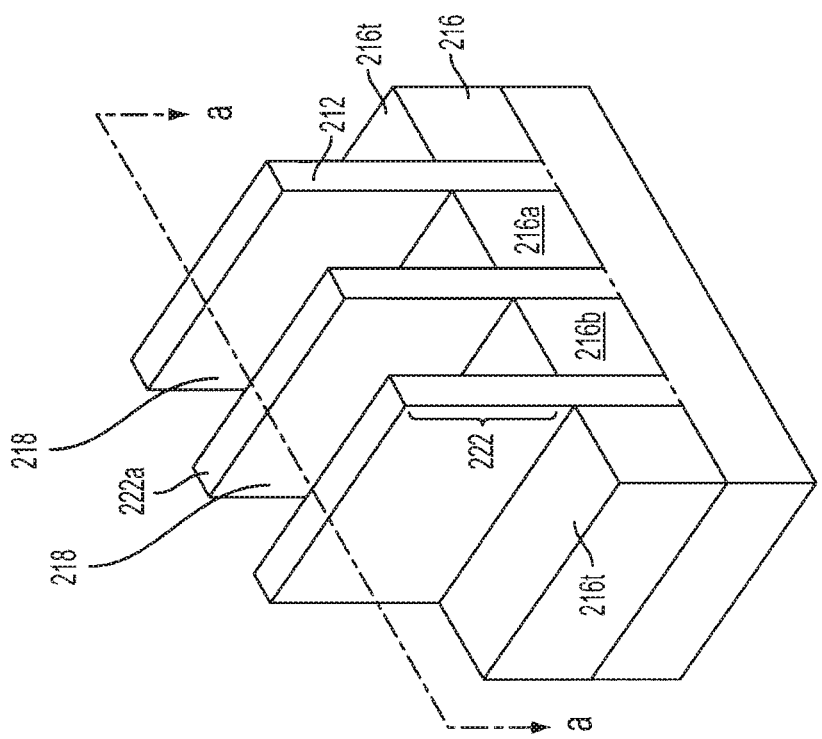

FIGS. 4A and 4B depict the resulting structure after the deposition of the dielectric material 214. A chemical mechanical polish is then performed, followed by the removal of the mask layer 204b and pad layer 204a. The resulting structure is shown in FIGS. 5A and 5B. FIG. 5A is a perspective view of the FinFET 200 at one of various stages of fabrication according to an embodiment, and FIG. 5B is a cross-sectional view of the FinFET taken along the line a-a of FIG. 5A. The remaining portions of the oxide 214 in the trenches 210 are hereinafter referred to as insulation regions 216. In at least one embodiment the mask layer 204b is formed of silicon nitride, the mask layer 204b may be removed using a wet process using hot H3PO4, while pad layer 204a may be removed using diluted HF acid, if formed of silicon oxide. In some alternative embodiments, the removal of the mask layer 204b and pad layer 204a may be performed after the recessing of the insulation regions 216, which recessing step is shown in FIGS. 6A and 6B.

The CMP process and the removal of the mask layer 204b and pad layer 204a produce the structure shown in FIGS. 5A/5B. As shown in FIGS. 6A and 6B, the insulation regions 216 are recessed by an etching step, resulting in recesses 218. In one embodiment, the etching step may be performed using a wet etching process, for example, by dipping the substrate 202 in hydrofluoric acid (HF). In another embodiment, the etching step may be performed using a dry etching process, for example, the dry etching process may be performed using CHF3 or BF3 as etching gases.

The remaining insulation regions 216 may comprise flat top surfaces 216t. The remaining insulation regions 216 may comprise first isolation region 216a and second isolation region 216b. Further, the upper portions 222 of the semiconductor fins 212 protruding over the flat top surfaces 216t of the remaining insulation regions 216 thus are used to form channel regions of the FinFETs 200. The upper portions 222 of the semiconductor fins 212 may comprise top surfaces 222t and sidewalls 222s. Height H of the upper portions 222 of the semiconductor fins 212 may range from 15 nm to about 50 nm. In some embodiments, the height H is greater than 50 nm or smaller than 15 nm. For simplicity, the upper portion 222 of the semiconductor fin 212 between the first and second insulation regions 216a, 216b is hereinafter referred to as channel fin 222a to illustrate each upper portion of the semiconductor fin 212, wherein the flat top surfaces 216t of the first and second insulation regions 216a, 216b are lower than the top surface 222t of the semiconductor fin 212.

The process steps up to this point have provided the substrate 202 having the first insulation region 216a and the second insulation region 216b having respective top surfaces 216t, and a fin 212 between the first and second insulation regions 216a, 216b, wherein the top surfaces 216t of the first and second insulation regions are lower than a top surface 222t of the fin 212.

FIG. 7A is a perspective view of the FinFET 200 at one of various stages of fabrication according to an embodiment, and FIG. 7B is a cross-sectional view of the FinFET taken along the line a-a of FIG. 7A. A gate stack 220 is formed over the substrate 202 over the top surface 222t and sidewalls 222s of a non-recessed portion of the channel fin 222a and extending to the flat top surfaces 216t of the first and second insulation regions 216a, 216b. In some embodiments, the gate stack 220 comprises a gate dielectric layer 220a and a gate electrode layer 220b over the gate dielectric layer 220a.

In FIGS. 7A and 7B, the gate dielectric 220a is formed to cover the top surface 222t and sidewalls 222s of the channel fin 222a. In some embodiments, the gate dielectric layer 220a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In the present embodiment, the gate dielectric layer 220a is a high-k dielectric layer with a thickness in the range of about 10 to 30 angstroms. The gate dielectric layer 220a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 220a may further comprise an interfacial layer (not shown) to reduce damage between the gate dielectric layer 220a and channel fin 222a. The interfacial layer may comprise silicon oxide.

The gate electrode layer 220b is then formed on the gate dielectric layer 220a. In at least one embodiment, the gate electrode layer 220b covers the upper portion 222 of more than one semiconductor fin 212, so that the resulting FinFET 200 comprises more than one fin. In some alternative embodiments, each of the upper portions 222 of the semiconductor fins 212 may be used to form a separate FinFET 200. In some embodiments, the gate electrode layer 220b may comprise a single layer or multilayer structure. In the present embodiment, the gate electrode layer 220b may comprise poly-silicon. Further, the gate electrode layer 220b may be doped poly-silicon with the uniform or non-uniform doping. In some alternative embodiments, the gate electrode layer 220b may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 220b comprises a thickness in the range of about 30 nm to about 60 nm. The gate electrode layer 220b may be formed using a suitable process such as ALD, CVD, PVD, plating, or combinations thereof.

Still referring to FIG. 7A, the FinFET 200 further comprises a dielectric layer 224 formed over the substrate 202 and along the side of the gate stack 220. In some embodiments, the dielectric layer 224 may include silicon oxide, silicon nitride, silicon oxy-nitride, or other suitable material. The dielectric layer 224 may comprise a single layer or multilayer structure. A blanket layer of the dielectric layer 224 may be formed by CVD, PVD, ALD, or other suitable technique. Then, an anisotropic etching is performed on the dielectric layer 224 to form a pair of spacers 224 on two sides of the gate stack 220. The dielectric layer 224 comprises a thickness ranging from about 5 to 15 nm.

Figures 8A, 8B:
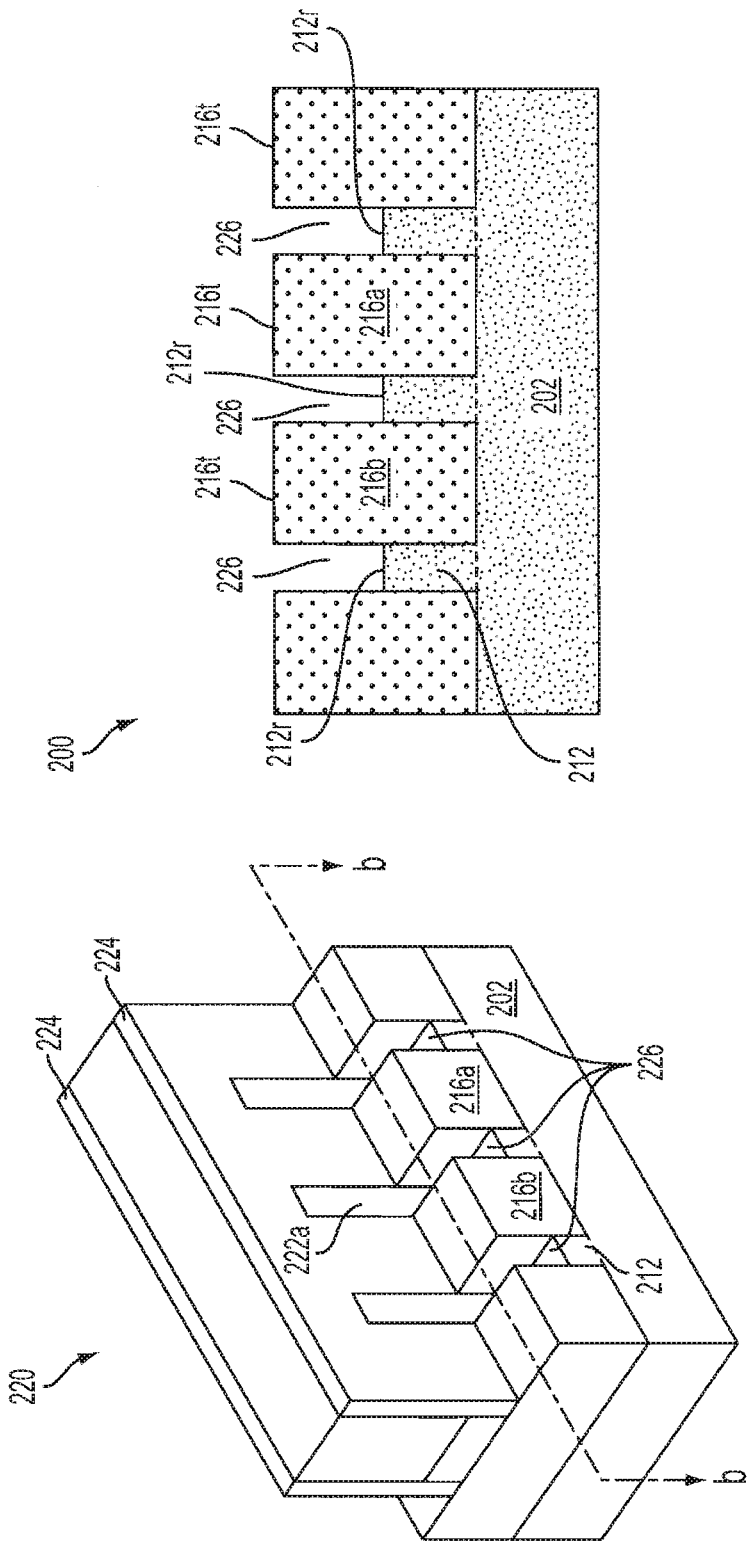

FIG. 8A is a perspective view of the FinFET 200 at one of various stages of fabrication according to an embodiment, and FIG. 8B is a cross-sectional view of the FinFET taken along the line b-b of FIG. 8A. The portion of the semiconductor fin 212 not covered by the gate stack 220 and spacers 224 formed thereover are recessed to form a recessed portion 226 of the fin 212 having a top surface 212r below the flat top surfaces 216t of the first and second insulation regions 216a, 216b. In one embodiment, using the pair of spacers 224 as hard masks, a biased etching process is performed to recess top surface 222t of the channel fin 222a that are unprotected or exposed to form the recessed portion 226 of the semiconductor fin 212. In an embodiment, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or Cl2 as etch gases. Also, in the embodiments provided, the bias voltage used in the etching process may be tuned to allow better control of an etching direction to achieve desired profiles for the recessed portion 226 of the semiconductor fin 212.

FIG. 9A is a perspective view of the FinFET 200 at one of various stages of fabrication according to an embodiment, and FIG. 9B is a cross-sectional view of the FinFET taken along the line b-b of FIG. 9A. Subsequent to the formation of the recessed portion 226 of the semiconductor fin 212, corners of the flat top surfaces 216t of the first and second insulation regions 216a, 216b not covered by the gate stack 220 are etched to form tapered top surfaces 216u of the first and second insulation regions 216a, 216b. In one embodiment, the etching step may be performed using a wet etching process, for example, by dipping the substrate 202 in hydrofluoric acid (HF). In another embodiment, the etching step may be performed using a non-biased dry etching process, for example, the dry etching process may be performed using CHF3 or BF3 as etching gases.

In one embodiment, the tapered top surfaces 216u of the first and second insulation regions 216a, 216b comprise a flat portion and sloped or beveled sidewalls (shown in FIGS. 9A and 9B). Therefore, a width W2 of the flat portion of the tapered top surface 216u is less than a maximum width W1 of the flat top surface 216u. In one embodiment, a ratio of the width W2 of the flat portion to a maximum width W3 of the first insulation region 216a is from 0.05 to 0.95. Further, a distance D1 of a lowest point of the tapered top surface 216u and the top surface 202s of the substrate 202 is in the range of about 100 to 200 nm.

FIG. 9C is a cross-sectional view of another FinFET 200 embodiment. In the embodiment depicted in FIG. 9C, the corners of the flat top surfaces 216t of the first and second insulation regions 216a, 216b not covered by the gate stack 220 are further removed until the flat portion of the tapered top surface 216u disappear to form a curved top portion of the tapered top surface 216u (shown in FIG. 9C). It is observed that the space between the neighboring semiconductor fins 212 have a middle line 228, and the curved top portion of the tapered top surface 216u close to the middle line 228 is higher than the curved top portion of the tapered top surface 216u close to the semiconductor fins 222. In other words, the tapered top surfaces 216u comprise a highest point P in the middle of the tapered top surfaces 216u. Further, a distance D2 of a lowest point of the tapered top surface 216u and the top surface 202s of the substrate 202 is in the range of about 100 to 200 nm. In one embodiment, the flat top surface 216t is coplanar with the highest point P of the tapered top surface 216u. In another embodiment, the flat top surface 216t is higher than the highest point P of the tapered top surface 216u. A distance D3 between the flat top surface 216t and the highest point P of the tapered top surface 216u is in the range of about 0.1 to 0.3 nm. In still another embodiment, the semiconductor fin 212 further comprises a non-recessed portion under a gate stack 220 having a top surface 222t higher than the tapered top surfaces 216u. A distance D4 between the top surface 222t of the non-recessed portion of the semiconductor fin 212 and the highest point P of the tapered top surface 216u is in the range of about 100 to 200 nm.

Figure 10B:
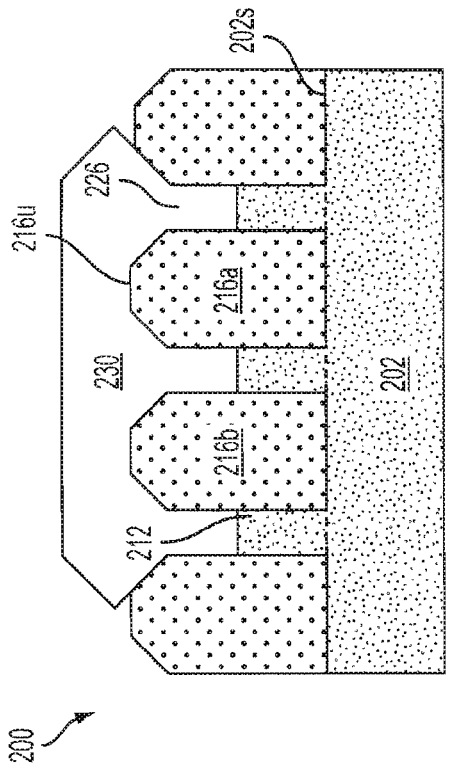
Figure 10C:
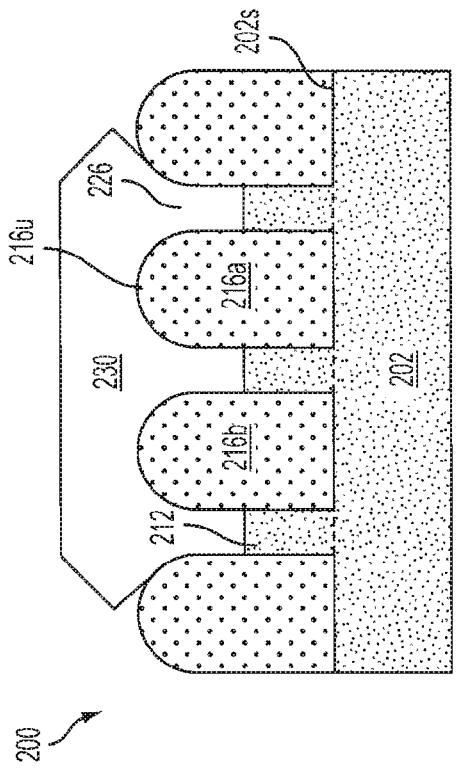
Figure 10A:
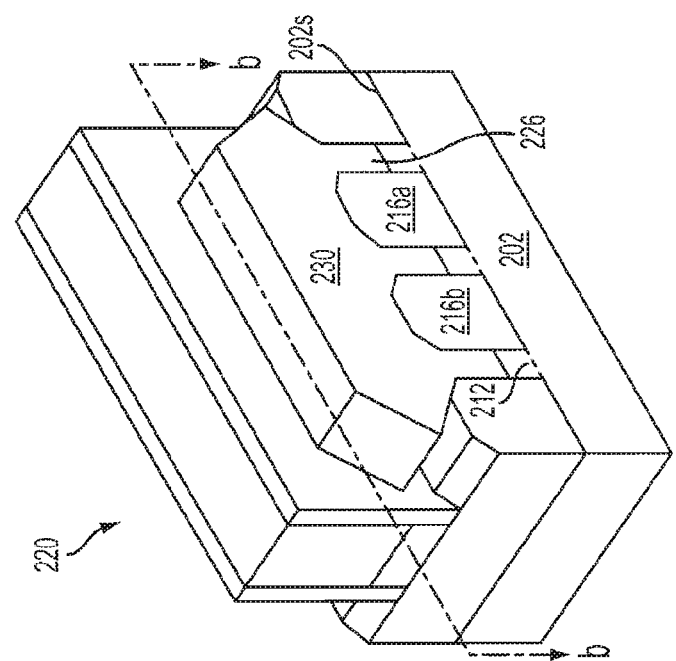

FIG. 10A is a perspective view of the FinFET 200 at one of various stages of fabrication according to an embodiment, and FIG. 10B is a cross-sectional view of the FinFET taken along the line b-b of FIG. 10A. FIG. 10C is a cross-sectional view of another FinFET 200 embodiment having strained material 230 formed over the structure depicted in FIG. 9C. Then, the structures depicted in FIGS. 10A, 10B, and 10C are produced by selectively growing a strained material 230 over the recessed portion 226 of the semiconductor fin 212 and extending over the tapered top surfaces 216u of the first and second insulation regions 216a, 216b. Since the lattice constant of the strained material 230 is different from the substrate 202, the channel region of the semiconductor fin 212 is strained or stressed to enable carrier mobility of the device and enhance the device performance. In at least one embodiment, the strained material 230, such as silicon carbon (SiC), is epi-grown by a LPCVD process to form the source and drain regions of the n-type FinFET. The LPCVD process is performed at a temperature of about 400 to 800° C. and under a pressure of about 1 to 200 Torr, using Si3H8 and SiH3CH as reaction gases. In at least another embodiment, the strained material 230, such as silicon germanium (SiGe), is epi-grown by a LPCVD process to form the source and drain regions of the p-type FinFET. The LPCVD process is performed at a temperature of about 400 to 800° C. and under a pressure of about 1 to 200 Torr, using SiH4 and GeH4 as reaction gases.

In the present embodiment, the selective growth of the strained material 230 continues until the material 230 extends vertically a distance ranging from about 10 to 100 nm above the surface 202a of the substrate 202 and extends laterally over the tapered top surfaces 216u of the first and second insulation regions 216a, 216b. It should be noted that tapered top surfaces 216u of the first and second insulation regions 216a, 216b make it easier for growth precursors to reach the growth surface during selective growth of the strained material 230 from different recessed portions 226 of the semiconductor fins 212 to eliminate voids under the merged strained materials 230. In some embodiments, the voids under the merged strained materials 230 reduce strain efficiency of the strained materials 230, i.e., the strained materials 230 with voids provide less strain into channel region of the FinFET than the configuration having no void formed in the strained materials 230, thereby increasing the likelihood of device instability and/or device failure. In the present embodiment, the strained material 230 has a substantially flat surface as the strained materials 230 grown from different recessed portions 226 are merged. Accordingly, the present method of fabricating a FinFET 200 may fabricate a reduced-void strained structure to enhance carrier mobility and the device performance.

It is understood that the FinFET 200 may undergo further CMOS processes to form various features such as contacts/vias, interconnect metal layers, dielectric layers, passivation layers, etc. It has been observed that the modified insulation and strained structure provides a given amount of strain into channel region of a FinFET, thereby enhancing the device performance.

One aspect of this description relates to a fin field effect transistor including a first insulation region and a second insulation region over a top surface of a substrate. The first insulation region includes tapered top surfaces, and the second insulation region includes tapered top surfaces. The fin field effect transistor further includes a fin extending above the top surface between the first insulation region and the second insulation region. The fin includes a first portion having a top surface below the tapered top surfaces of the first insulation region. The fin includes a second portion having a top surface above the tapered top surfaces of the first insulation region.

Another aspect of this description relates to a fin field effect transistor including a first insulation region over a top surface of a substrate, the first insulation region includes a tapered top surface. The fin field effect transistor further includes a second insulation region over the top surface of the substrate. The fin field effect transistor further includes a fin extending from the substrate, the fin located between the first insulation region and the second insulation region. The fin field effect transistor further includes a gate stack covering a first portion of the fin, the gate stack exposing a second portion of the fin, wherein a top surface of the first portion of the fin is above the tapered top surface, and a top surface of the second portion of the fin is below the tapered top surface.

Still another aspect of this description relates to a method of fabricating a fin field effect transistor (FinFET). The method includes forming a first insulation region and a second insulation region having respective top surfaces. The method further includes forming a fin between the first and second insulation regions, wherein the top surfaces of the first and second insulation regions are below a top surface of the fin. The method further includes forming a gate stack over a portion of the fin and over a portion of the first and second insulation regions. The method further includes tapering the top surfaces of the first and second insulation regions not covered by the gate stack.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a fin field effect transistor (FinFET), the method comprising:
   forming a first insulation region and a second insulation region having respective top surfaces;
   forming a fin between the first and second insulation regions, wherein the top surfaces of the first and second insulation regions are below a top surface of the fin;
   forming a gate stack over a portion of the fin and over a portion of the first and second insulation regions; and
   tapering the top surfaces of the first and second insulation regions not covered by the gate stack.

2. The method of claim 1, wherein forming the gate stack comprises:
   forming a gate electrode layer; and
   forming a pair of spacers, wherein a first spacer of the pair of spacers is on a first side of the gate electrode layer, and a second spacer of the pair of spacers is on a second side of the gate electrode layer, the second side being opposite the first side.

3. The method of claim 1, further comprising etching a portion of the fin exposed by the gate stack using the gate stack as a mask.

4. The method of claim 1, wherein etching the portion of the fin comprises etching the portion of the fin using at least one of HBr or $Cl_2$ gas.

5. The method of claim 1, wherein tapering the top surfaces of the first and second insulation regions comprises:
   forming a first surface substantially parallel to a top surface of the fin; and
   forming a second surface at an angle to the first surface.

6. The method of claim 1, wherein tapering the top surfaces of the first and second insulation region comprises forming a continuously curved surface.

7. The method of claim 1, further comprising growing a strained material over the tapered top surfaces of the first and second insulation regions at a temperature ranging from about 400° C. to about 800° C.

8. The method of claim 7, wherein growing the strained layer comprises growing the strained layer including at least one of silicon carbon or silicon germanium.

9. The method of claim 7, wherein growing the strained material comprises growing the strained material over the tapered top surfaces in a direction substantially parallel to a top surface of the fin.

10. The method of claim 7, wherein the growing the strained material including forming an interface between the strained material and tapered top surfaces of the first and second insulating regions.

11. A method of fabricating a fin field effect transistor (FinFET), the method comprising:
   providing a substrate having an insulation region and a fin abutting the insulation region;
   recessing a portion of the fin to form a recessed portion of the fin below a top surface of the insulation region;
   etching at least a portion of the top surface of insulation region adjacent the recessed portion of the fin; and
   forming a semiconductor material over the recessed portion of the fin and the etched top surfaces of the insulation region.

12. The method of claim 11, wherein the etching is a wet etching process.

13. The method of claim 11, wherein the forming the semiconductor material includes an epitaxial growth process including the semiconductor material formed on the recessed portion of the fin merging with another semiconductor material grown on an adjacent fin.

14. The method of claim 11, wherein the forming the semiconductor material includes a chemical vapor deposition (CVD) process.

15. The method of claim 11, wherein the etching is a dry etching process.

16. The method of claim 11, wherein the recessing the portion of the fin includes using spacer elements of a gate stack as a masking element during the recessing.

17. A method of fabricating a semiconductor device, the method comprising:
   providing a substrate having a first insulation region and a second insulation region having respective top surfaces, and a fin between the first and second insulation regions;
   forming a gate stack over a first portion of the fin and extending over a first region of the first and second insulating regions, wherein the first region of the first and second insulating regions have top surfaces having a first height;
   recessing a second portion of the fin adjacent the first portion of fin, wherein the recessing exposes sidewalls of a second region of each of the first and second insulation regions;
   etching the second region of the first and second insulation regions to form top surfaces having a second height, wherein the second height is less than the first height; and
   growing a semiconductor material over the recessed second portion of the fin and etched second region of the first and second insulation regions.

18. The method of claim 17, wherein the etching the second region of the first and second insulating regions forms tapered top surfaces of the first and second insulation regions.

19. The method of claim 18, wherein the etching the second region of the first and second insulating regions forms tapered top surfaces of the first and second insulation regions and wherein the tapered top surfaces are curved surfaces.

20. The method of claim 18, wherein the tapered top surfaces include an upper surface and two oblique surfaces.

* * * * *